United States Patent
Chang et al.

[19]

[11] Patent Number: 5,877,064
[45] Date of Patent: Mar. 2, 1999

[54] METHOD FOR MARKING A WAFER

[75] Inventors: Chao-Hsin Chang; Yung-Fa Lin, both of Hsin-Chu, Taiwan

[73] Assignee: Taiwan Semiconductor Manufacturing Co.Ltd, Hsin-Chu, Taiwan

[21] Appl. No.: 893,102

[22] Filed: Jul. 15, 1997

[51] Int. Cl.⁶ .................................................. H01L 21/306
[52] U.S. Cl. ........................... 438/401; 438/694; 438/700
[58] Field of Search ...................................... 438/401, 694

[56] References Cited

U.S. PATENT DOCUMENTS

| | | | |
|---|---|---|---|
| 3,752,589 | 8/1973 | Kobayashi | 356/401 |
| 4,166,574 | 9/1979 | Yokoyama | 235/375 |
| 4,470,875 | 9/1984 | Poteat | 438/701 |
| 4,510,673 | 4/1985 | Shils et al. | 438/15 |
| 4,534,804 | 8/1985 | Cade | 438/694 |
| 4,732,646 | 3/1988 | Elsner et al. | 438/694 |
| 5,067,437 | 11/1997 | Watanabe | 118/715 |
| 5,200,798 | 4/1993 | Katagiri et al. | 356/363 |
| 5,408,320 | 4/1995 | Katagiri et al. | 356/363 |
| 5,498,902 | 3/1996 | Hara | 257/686 |
| 5,503,962 | 4/1996 | Caldwell | 430/317 |
| 5,541,731 | 7/1996 | Freedenberg | 356/345 |
| 5,610,104 | 3/1997 | Mitchell | 428/428 |

Primary Examiner—Charles Bowers
Assistant Examiner—Craig Thompson
Attorney, Agent, or Firm—Tung & Associates

[57] ABSTRACT

The present invention discloses a method for marking a wafer surface with minimized particulate contamination problem and further, the method is compatible with a chemical mechanical polishing method for planarization. An identification mark can be made on the non-patterned side of a wafer by a high energy laser beam either with or without an insulating layer deposited on top of the wafer. The method can also be carried out by first providing an identification mark on a non-patterned surface of the wafer and then, after all fabrication processes have been conducted on the patterned side of the wafer and a planarization process is conducted by a chemical mechanical polishing method, the identification mark on the backside of the wafer can be automatically read and then reproduced on the patterned side of the wafer prior to the shipment of the wafer to a customer or to a packaging facility. The present invention method significantly reduces the particle contamination problem that is frequently caused by laser scribing a silicon surface and furthermore, substantially eliminates the problem that an identification mark becomes illegible after a planarization process by chemical mechanical polishing.

13 Claims, 2 Drawing Sheets

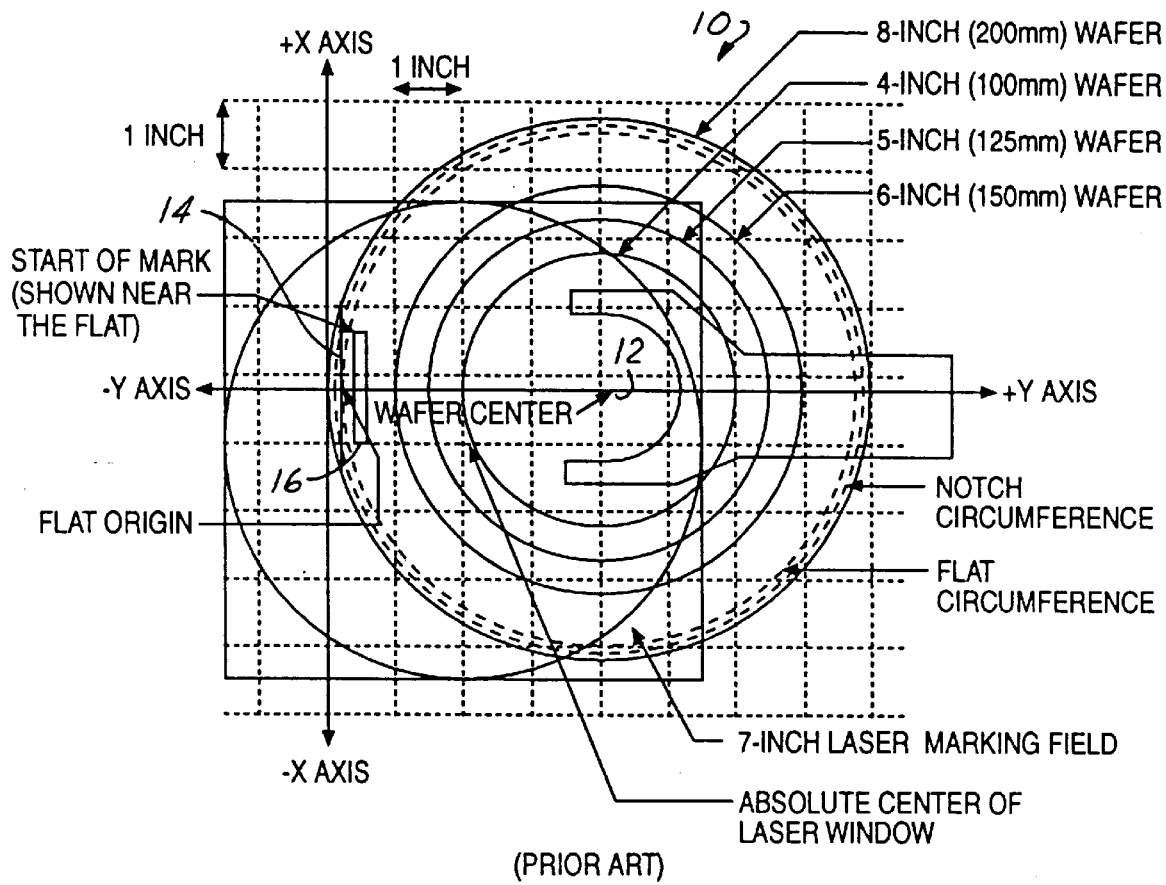
(PRIOR ART)
FIG. 1
(PRIOR ART)
FIG. 2
FIG. 5

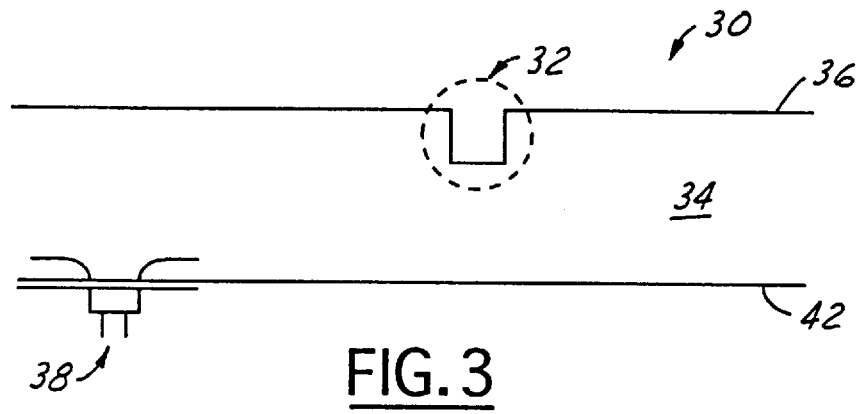
FIG. 3
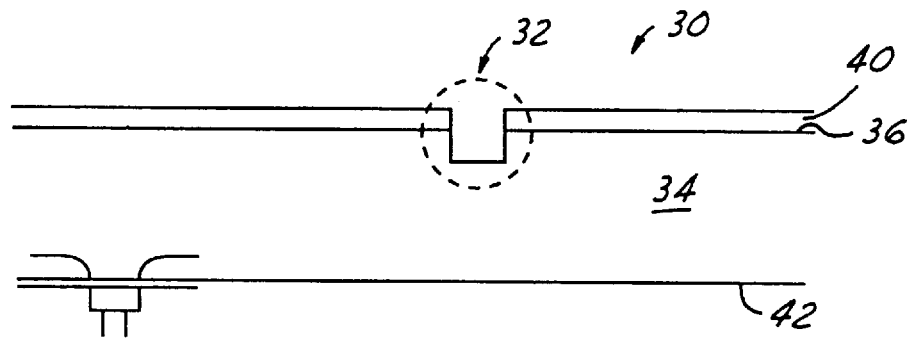
FIG. 4
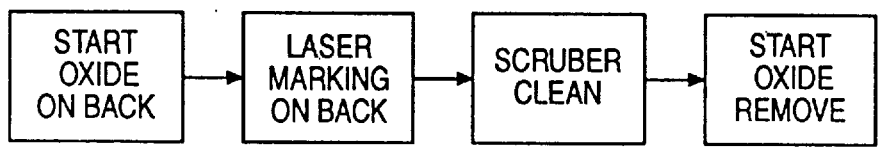
FIG. 4A

METHOD FOR MARKING A WAFER

FIELD OF THE INVENTION

The present invention generally relates to a method of marking a semiconductor wafer and more particularly, relates to a method of marking a non-patterned side of a wafer and then reproducing the mark on a patterned side of the wafer after a planarization process is performed on the wafer.

BACKGROUND OF THE INVENTION

In the fabrication of semiconductor devices, semi-conducting substrates or wafers of silicon nature are generally used as a foundation for building electronic devices thereon. To properly identify these substrates or wafers, identification marks must be suitably placed on the wafer such that the wafers can be readily identified throughout the fabrication process. The fabrication process for semiconductor devices may consist of as many as several hundred processing steps which are conducted at different processing stations by different fabrication equipment. A reliable method of identification of these wafers by their lot numbers is therefore very important not only from a production control point of view, but also for future tracking of the semiconductor devices that are built when quality issue or discrepancy arises.

Traditionally, identification marks are provided on a substrate or wafer on the patterned side where electronic devices are built. A typical wafer, which may have a size of 100 mm, 125 mm, 150 mm or 200 mm is shown in FIG. 1. The wafer 10 which has a wafer center 12 and a flat edge 14. The wafer 10 can be suitably marked in an area 16 generally defined at a location near the flat edge 14. In marking an identification number, a laser beam can be used to scribe directly the identification marks into a silicon layer, or first through an insulating layer which is frequently formed on a silicon wafer and then into the silicon layer.

FIG. 2 shows an enlarged, cross-sectional view of a scribe mark 20 formed on the silicon wafer 10 of FIG. 1. It is seen that on wafer 10, electronic device 22 is built on the patterned surface 24 of the wafer. The scribe mark 20 represents a volume that is defined by the width of the bottom 26 of the mark times the height of the side wall 28 times the length (not shown) of the mark made in the wafer surface 24. The volume of the scribe mark 20 represents an amount of silicon that is removed from the wafer surface 24 by a laser scribing machine or other suitable cutting tools. The removal of the volume of silicon material from the mark 20 in the laser scribing process creates silicon particles or dust as a potential source of wafer contamination. The silicon particles or dust may contaminate the wafer surface or the interior surface of the process chamber which may then fall off the chamber wall onto the wafer surface. Even though a wet chemical cleaning process is normally performed to clean out the silicon particles after a laser scribing process, it may not be sufficiently effective in eliminating all contaminating particles.

During a laser scribing process, a high energy laser beam bombards the wafer surface such that silicon particles from the bombarded area form clusters or bumps of silicon on the wafer surface near the mark it created. In the subsequent processing steps for the wafer, a wafer clamp or other wafer holding device may be used for fixing a wafer on a wafer stage in certain process machines, the bumps of silicon material may be crushed into silicon particles as additional sources of contamination for the wafer surface.

An additional problem associated with the method of laser scribing the patterned side of a wafer has been observed when a chemical mechanical polishing (CMP) is used for planarizing a wafer surface. When the wafer surface is planarized by the CMP process, a very smooth surface is obtained which essentially smears out the identification mark and makes it illegible under a light source. As a result, the identification of the lot number or any other marks on the patterned surface of the wafers becomes a very difficult task.

It is therefore an object of the present invention to provide a method for marking a wafer surface that does not have the drawbacks or shortcomings of the conventional wafer marking techniques.

It is another object of the present invention to provide a method for marking a wafer surface that minimizes the wafer contamination problem caused by silicon particles produced by a laser scribing process.

It is a further object of the present invention to provide a method for marking a wafer surface that is capable of producing a legible identification mark even after a planarization process conducted by a chemical mechanical polishing technique.

It is still another object of the present invention to provide a method for marking a wafer surface by marking the non-patterned or the backside of a wafer.

It is another further object of the present invention to provide a method for marking a silicon wafer that is compatible with a planarization process by first providing a mark on the non-patterned side of the wafer and then reproducing such mark on the patterned side of the wafer after such planarization process.

It is yet another object of the present invention to provide a method for marking a wafer surface by first forming an insulating layer on the surface of the non-patterned side of the wafer and then laser scribing an identification mark in the wafer surface.

It is still another further object of the present invention to provide a method for marking a wafer surface by first providing an oxide layer on top of a non-patterned wafer surface, scribing an identification mark through the oxide layer into the wafer surface and then removing the oxide layer.

It is yet another further object of the present invention to provide a wafer that has a recognizable identification mark on the pattern side of the wafer after the non-patterned side of the wafer is planarized by a grinding process.

SUMMARY OF THE INVENTION

In accordance with the present invention, a method for marking a wafer surface which does not have the drawbacks or shortcomings of a conventional laser scribing process is provided.

In a preferred embodiment of the process, the method can be carried out by first providing a wafer that has a top surface and a bottom surface, wherein the top surface is to be patterned and the bottom surface is not to be patterned, and then focusing a high energy beam on the bottom surface of the wafer such that a surface layer of the wafer is removed to form a mark.

In an alternate embodiment of the process, the method for marking a silicon wafer can be carried out by first providing a silicon wafer which has a top surface and a bottom surface, the top surface is to be patterned and the bottom surface is not to be patterned, forming a layer of silicon oxide on the bottom surface of the wafer, and then focusing a high energy beam on the bottom surface of the wafer such that at least a section of the layer of silicon oxide and the silicon are removed.

In another alternate embodiment, the present invention method for marking a silicon wafer can be carried out by the steps of first providing a wafer that has a top surface and a bottom surface wherein the top surface is to be patterned and the bottom surface is not to be patterned, then focusing a high energy beam on the bottom surface of the wafer such that a surface layer of the wafer is removed to form a mark, then patterning the top surface of the wafer and forming semiconductor devices, then planarizing a top surface of the semiconductor device, and then reading the mark on the bottom surface of the wafer and reproducing the mark by a high energy beam on the planarized top surface of the semiconductor device.

BRIEF DESCRIPTION OF THE DRAWINGS

These and other objects, features and advantages of the present invention will become apparent from the following detailed description and the appended drawings in which:

FIG. 1 is an illustration of wafers of conventional sizes and the location of identification mark normally placed on such wafers.

FIG. 2 is an enlarged, cross-sectional view of an identification mark formed on the wafer of FIG. 1.

FIG. 3 is an enlarged, cross-sectional view of an identification mark formed by the present invention method on the backside, or the non-patterned side of a wafer.

FIG. 4 is an enlarged, cross-sectional view of an identification mark formed by an alternate embodiment of the present invention method.

FIG. 4A is a block diagram illustrating the process flow of the alternate embodiment shown in FIG. 4.

FIG. 5 is a block diagram illustrating the process flow of the present invention method in a second alternate embodiment.

DETAILED DESCRIPTION OF THE PREFERRED AND ALTERNATE EMBODIMENTS

The present invention discloses a method for marking a wafer surface by making an identification mark on the backside or the non-patterned side of the wafer such that particle contamination to the wafer surface on the patterned side can be minimized or eliminated. In an alternate embodiment, the present invention method provides a marking process for a wafer surface that is compatible with a CMP planarization process which can be carried out by first making an identification mark on the non-patterned side of the wafer, and then reproducing such mark on the patterned side of the wafer after a CMP planarization process is conducted on the patterned side.

Referring now to FIG. 3 wherein an enlarged, cross-sectional view of a wafer 30 having an identification mark 32 formed on the wafer surface 36 is shown. The silicon substrate 34, should not be substantially penetrated or cut through. This means that a depth of less than 1500 Å is normally penetrated into the wafer surface 36. It should be noted that the wafer surface 36 shown in FIG. 3 is the back side or the non-patterned side of the wafer where electronic devices are not to be built in the silicon.

A suitable laser equipment to be used in a scribing process can be any of those commercially available lasers. For instance, a continuous Nd/YAG laser having a power level between 1 and 2 watts can be suitably used. The laser can be utilized either in an engraving mode or in a dot matrix mode. When the engraving mode is used, a focused high energy beam of laser can be scanned on the surface of a wafer at a rate of approximately 0.5~2 inch/second, When the laser is utilized in a dot matrix mode, such as that utilized in the present invention method, the laser can be operated at a pulse rate of about 500–2000 Hz frequency. The power of the laser can be suitably adjusted such that only a desirable depth of the silicon layer is removed. This not only reduces the potential of particle contamination, but also minimizes the stress built-up in the silicon layer due to the mark formation.

FIG. 3 also shows an electronic device 38 that is built on the patterned side 42 of the wafer 30. It should be noted that the dimensions of the identification mark 32 and that of the electronic device 38 are arbitrarily selected to illustrate the present invention and therefore, they are not proportional to their true dimensions.

In an alternate embodiment of the present invention, an insulating material layer 40 is first formed on the wafer surface 36. A suitable insulating material layer 40 formed on the wafer surface 36 can be a start oxide layer having a thickness of between about 1 $\mu$m and about 10 $\mu$m. The start oxide layer 40 can be formed in a dry oxidation process conducted in a high temperature furnace. For instance, a dry oxidation or atmospheric oxidation can be performed by oxidizing a wafer surface in dry oxygen at a high temperature such that the surface of the silicon wafer is converted into silicon dioxide. The dry oxidation temperature can be suitably selected at a temperature of not less than 800° C., and preferably at not less than 1,000° C. The dry oxidation process is normally conducted in a resistance-heated furnace or in a rapid-thermal processing chamber. When the process is conducted in a furnace, dry oxygen can be mixed with an inert gas such as nitrogen for passing over the surface of a wafer maintained at a high temperature. The time required for such oxidation must be sufficient to oxidize the silicon surface to a suitable thickness. For instance, when a thickness of 2 $\mu$m is desired, the oxidation process should be conducted for at least about two hours. When a thicker oxide layer is desired, the oxidation process can be conducted for a time period between 2 and 10 hours.

The benefits of forming an insulating layer such as a silicon dioxide layer 40 on top of the wafer 30 during a laser marking process are several. First, the addition of the oxide layer 40 reduces the formation of silicon particles as a potential contamination source. The additional side wall thickness of the oxide layer 40 helps to reduce the number of silicon particles escaping outside the mark 32. Secondly, the presence of the oxide layer 40 eliminates the formation of silicon bumps on the surface 36 at or near the mark 32. This prevents the silicon bumps from being crushed by a wafer holding device in subsequent processing steps which further produces contamination particles. The oxide layer 40 can be suitable removed after the laser scribing process by a wet etch method. For instance, the oxide layer 40 can be suitably removed by wet etching with hydrofluoric acid or any other suitable acids.

Referring now to FIG. 4A which is a block diagram illustrating the process flow for the present invention alternate embodiment shown in FIG. 4. In the first block 46, a start oxide layer between about 1 $\mu$m and about 10 $\mu$m thickness is deposited on top of the wafer surface. The non-patterned side 42 of the wafer is then laser marked with an identification mark, as shown in block 48. After the laser marking process is completed on the backside or the non-patterned side of the wafer, the wafer is cleaned in a scrubber with DI water or any other suitable solvents. This is shown in block 50. In the last step of the process, as shown in block 52, the start oxide layer is removed in a wet etch process.

In a second alternate embodiment, the present invention method of forming an identification mark on a wafer surface can be carried out by first forming a start oxide layer on the non-patterned side of the wafer, as shown in block 62 of FIG. 5. A laser scribing equipment is then used to make an identification mark on the non-patterned side of the wafer, as shown in block 64. After the laser marking process is completed on the backside of the wafer, the wafer is cleaned in a scrubber by a jet of DI water or any other suitable solvents, This is shown in block 66. In this specific embodiment, the patterned side of the wafer is then marked with an identification mark, as shown in block 68, by first reading the identification mark on the non-patterned side by a mark reading device and then reproducing such mark by a focused high energy beam of laser on the patterned side of the wafer. This step is normally conducted after all the fabrication steps have been conducted on the patterned side of the wafer and furthermore, after the top surface of the patterned side of the wafer has been planarized by a planarization process, i.e., a chemical mechanical polishing technique.

The problem that is normally associated with the CMP process wherein an identification mark originally placed on the patterned side may not be legible due to the creation of a smooth surface by the CMP process is eliminated. By practicing this alternate embodiment of the present invention, an identification mark can be made on the patterned side of the wafer after the fabrication steps are completed and before the wafer is shipped to customer or to a packaging facility. After the patterned side of the wafer is marked with the identification mark, the non-patterned side of the wafer can be processed by either a wet etch method to remove the start oxide layer or by a grinding process to achieve a planar surface on the backside of the wafer. This is shown as block 70 in FIG. 5. In this second alternate embodiment, the start oxide layer minimizes the formation of silicon particles as a potential contamination source and furthermore, provides a clear identification mark on the patterned side of the wafer after the fabrication process on the wafer has been completed, and thus eliminating problems normally associated with a chemical mechanical polishing method.

The present invention method of providing an identification mark on the non-patterned side of a wafer, or first providing an identification mark on the non-patterned side and then reproducing the mark on the patterned side of the wafer is therefore amply demonstrated by the above descriptions and the appended drawings. It should be noted that while a start oxide layer is illustrated as an insulating layer used in the alternate embodiment of the present invention method, any other insulating layers can be suitably used to carry out the present invention novel method as long as it is capable of achieving contamination control and capable of being etched by a laser beam.

While the present invention has been described in an illustrative manner, it should be understood that the terminology used is intended to be in a nature of words of description rather than of limitation.

Furthermore, while the present invention has been described in terms of a preferred embodiment and the alternate embodiments, it is to be appreciated that those skilled in the art will readily apply these teachings to other possible variations of the inventions.

The embodiments of the invention in which an exclusive property or privilege is claimed are defined as follows:

1. A method for marking a silicon wafer comprising the steps of:

providing a silicon wafer having a top surface and a bottom surface, said top surface is to be patterned and said bottom surface is not to be patterned, forming a layer of silicon oxide on said bottom surface of the wafer, and focusing a high energy beam on said bottom surface of the wafer such that at least a section of layers of silicon oxide and silicon are removed to form a mark.

2. A method according to claim 1 further comprising the step of removing said silicon oxide layer from said bottom surface of the wafer after said focusing step.

3. A method according to claim 1, wherein said silicon oxide layer is formed by a furnace method.

4. A method according to claim 1, wherein said silicon oxide layer formed on said bottom surface of the wafer has a thickness between about 1 $\mu$m and about 10 $\mu$m.

5. A method according to claim 1, wherein said high energy beam is a laser beam.

6. A method according to claim 1, wherein said high energy beam is generated by a Nd/YAG laser operated in a dot matrix mode.

7. A method according to claim 1, wherein a silicon layer removed has a thickness of at least about 50 Å.

8. A method for marking a wafer comprising the steps of:

providing a wafer having a top surface and a bottom surface, said top surface is to be patterned and said bottom surface is not to be patterned, focusing a high energy beam on said bottom surface of the wafer such that a surface layer of said wafer is removed to form a mark, patterning said top surface of the wafer and forming electronic devices, planarizing a top surface of said electronic devices, and reading said mark on the bottom surface of the wafer and reproducing said mark by a high energy beam on said planarized top surface of said electronic devices.

9. A method according to claim 8 further comprising the step of forming an oxide layer on said bottom surface of the wafer prior to said focusing step.

10. A method according to claim 8 further comprising the step of removing said oxide layer after said focusing step.

11. A method according to claim 8, wherein said planarization step for said top surface of said electronic devices is carried out by a chemical mechanical polishing technique.

12. A method according to claim 8 further comprising the step of grinding the bottom surface of the wafer smooth after said mark is reproduced on said planarized top surface of said electronic devices.

13. A method according to claim 8, wherein said mark produced is a wafer lot identification number.

* * * * *